(12) United States Patent (10) Patent No.: US 7,781,807 B2
Nishihara et al. (45) Date of Patent: Aug. 24, 2010

(54) NON-VOLATILE SEMICONDUCTOR STORAGE DEVICE

(75) Inventors: Kiyohito Nishihara, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

(21) Appl. No.: 11/947,008

(22) Filed: Nov. 29, 2007

(65) Prior Publication Data

US 2008/0128780 A1 Jun. 5, 2008

(30) Foreign Application Priority Data

Nov. 30, 2006 (JP) .............................. 2006-324471

(51) Int. Cl.
*H01L 29/80* (2006.01)
(52) U.S. Cl. ....................... 257/250; 257/315; 257/347
(58) Field of Classification Search ................. 257/315, 257/250, 278, 347
See application file for complete search history.

(56) References Cited

U.S. PATENT DOCUMENTS

| | | | |
|---|---|---|---|
| 6,888,750 | B2 | 5/2005 | Walker et al. |
| 2006/0049449 | A1 * | 3/2006 | Iino et al. .................... 257/315 |
| 2006/0245251 | A1 | 11/2006 | Shirota et al. |
| 2007/0102749 | A1 | 5/2007 | Shirota et al. |
| 2007/0126033 | A1 * | 6/2007 | Walker et al. ............... 257/250 |
| 2007/0128815 | A1 | 6/2007 | Iino et al. |
| 2007/0138536 | A1 | 6/2007 | Arai et al. |

FOREIGN PATENT DOCUMENTS

JP 2004-265975 9/2004

OTHER PUBLICATIONS

U.S. Appl. No. 12/394,929, filed Feb. 27, 2009, Shiino, et al.
U.S. Appl. No. 12/404,804, filed Mar. 16, 2009, Sakaguchi et al.
U.S. Appl. No. 12/405,544, filed Mar. 17, 2009, Sakamoto.
U.S. Appl. No. 12/061,075, filed Apr. 2, 2008, Mizukami, et al.
U.S. Appl. No. 12/508,904, filed Jul. 24, 2009, Kamigaichi, et al.

(Continued)

*Primary Examiner*—Phat X Cao
(74) *Attorney, Agent, or Firm*—Oblon, Spivak, McClelland, Maier & Neustadt, L.L.P.

(57) ABSTRACT

A three-dimensional non-volatile semiconductor storage device which realizes both increased packing density and improved performance is disclosed. According to one aspect, there is provided a non-volatile semiconductor storage device comprising a first non-volatile memory cell provided on a first insulator, which includes a first semiconductor layer, and a first gate stack provided above the first semiconductor layer and including a first charge storage layer and a first control gate electrode, and a second non-volatile memory cell provided above the first non-volatile memory cell, which includes a second semiconductor layer, and a second gate stack provided above the second semiconductor layer and including a second charge storage layer and a second control gate electrode, the second gate stack being positioned to be aligned with the first gate stack, and wherein the first control gate electrode functions as a back gate electrode to the second non-volatile memory cell.

7 Claims, 6 Drawing Sheets

OTHER PUBLICATIONS

U.S. Appl. No. 11/841,257, filed Aug. 20, 2007, Makoto Mizukami, et al.
U.S. Appl. No. 11/680,912, filed Mar. 1, 2007, Wataru Saito, et al.
Soon-Moon Jung, et al., "Three Dimensionally Stacked NAND Flash Memory Technology Using Stacking Single Crystal Si Layers on ILD and TANOS Structure for Beyond 30nm Node", International Electron Device Meeting, 2006 (IEDM'06), Dec. 11-13, 2006, 4 pages.
U.S. Appl. No. 12/211,947, filed Sep. 17, 2008, Nishihara, et al.
U.S. Appl. No. 12/244,307, filed Oct. 2, 2008, Mizukami, et al.
U.S. Appl. No. 12/564,349, filed Sep. 22, 2009, Mizukami, et al.
U.S. Appl. No. 12/603,099, filed Oct. 21, 2009, Mizukami, et al.

* cited by examiner

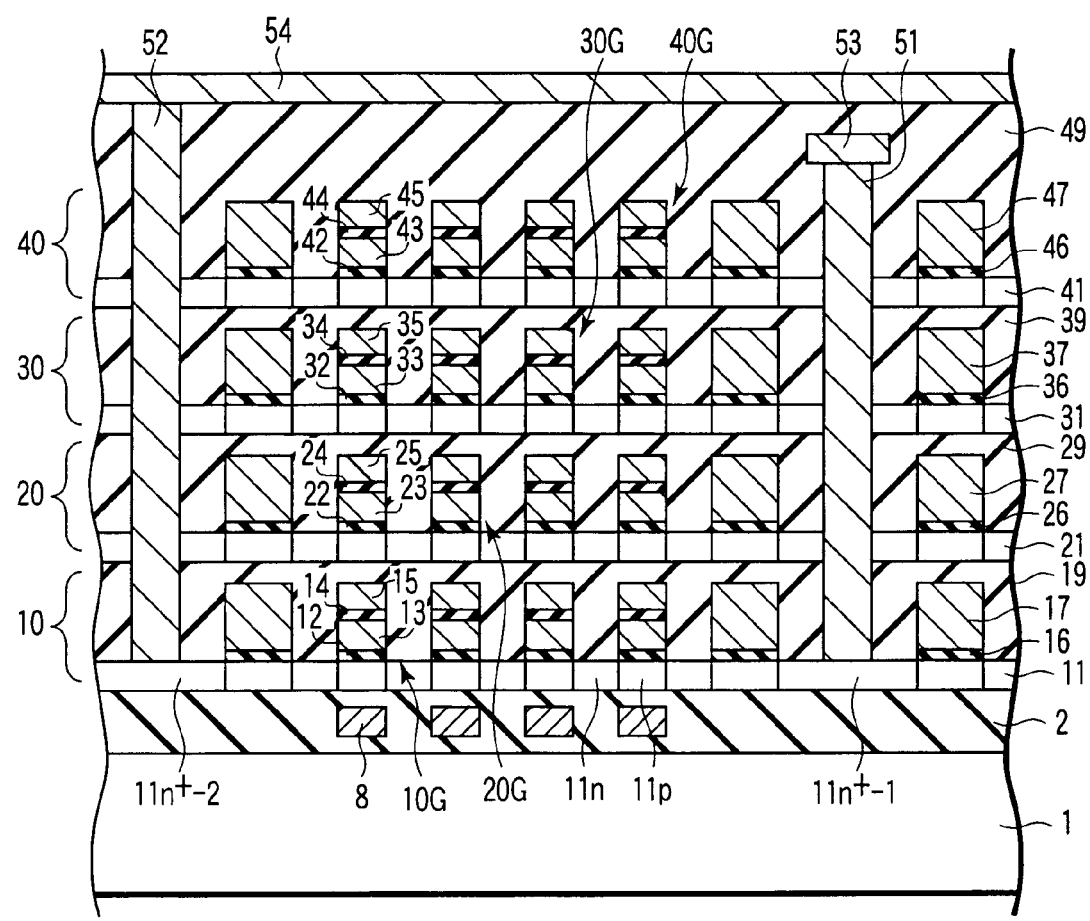
F I G. 3

NON-VOLATILE SEMICONDUCTOR STORAGE DEVICE

CROSS-REFERENCE TO RELATED APPLICATIONS

This application is based upon and claims the benefit of priority from prior Japanese Patent Application No. 2006-324471, filed Nov. 30, 2006, the entire contents of which are incorporated herein by reference.

BACKGROUND OF THE INVENTION

1. Field of the Invention

The present invention relates to a non-volatile semiconductor storage device, and more particularly to a three-dimensional non-volatile semiconductor storage device including a charge storage layer.

2. Description of the Related Art

High integration and increased packing density of a semiconductor device have been realized based on a reduction in a minimum feature size. In a non-volatile semiconductor storage device, further continuously advancing a cell size of a memory cell based on a reduction in a minimum feature size is gradually becoming difficult due to restrictions imposed on its manufacturing processes and device designs. One of measures which solve this difficulty in miniaturization is realizing a three-dimensional semiconductor device.

An example of the three-dimensional non-volatile semiconductor storage device is disclosed in a specification of U.S. Pat. No. 6,888,750. The non-volatile semiconductor storage device has a structure where a plurality of layers of silicon-on-insulator (SOI) type memory cell arrays of non-volatile semiconductor storage devices and a plurality of interlevel insulator layers are simply laminated one another. Each memory cell array includes a plurality of stripe-like bit lines formed on the interlevel insulator, gate stacks arranged in a two-dimensional matrix each including a charge storage layer and a control gate electrode, and word lines which are provided on the control gate electrodes and connect the control gate electrodes in a direction vertical to the bit line direction. That is, the bit lines, the gate stacks, and the word lines are configured as the single layer of the memory cell array which is covered with the interlevel insulator, and the plurality of layers of memory cell arrays are laminated.

Another example of a three-dimensional semiconductor device having different structure is disclosed in Jpn. Pat. Appln. KOKAI Publication No. 2004-265975. The three-dimensional semiconductor device uses a bonding technology. According to this technology, a first semiconductor device is formed on a first SOI substrate, and is covered with an interlevel insulator to be planarized. The interlevel insulator is bonded to a second SOI substrate, a first support substrate of the first SOI layer is removed to leave a very thin semiconductor layer near a surface of the support substrate, and a second semiconductor device and/or an interconnection line are formed on the remained thin semiconductor layer.

BRIEF SUMMARY OF THE INVENTION

According to one aspect of the present invention, there is provided a non-volatile semiconductor storage device comprising: a first non-volatile memory cell provided on a first insulator above a substrate; and a second non-volatile memory cell provided on a second insulator above the first non-volatile memory cell, wherein the first non-volatile memory cell includes: a first semiconductor layer including an n-type region and a p-type region; and a first gate stack which is provided above the first semiconductor layer and includes a first charge storage layer and a first control gate electrode, the second non-volatile memory cell includes: a second semiconductor layer including an n-type region and a p-type region; and a second gate stack which is provided above the second semiconductor layer and includes a second charge storage layer and a second control gate electrode, the second gate stack being positioned to be aligned with the first gate stack, and wherein the first control gate electrode functions as a back gate electrode with respect to the second non-volatile memory cell.

According to another aspect of the present invention, there is provided a non-volatile semiconductor storage device comprising: a first non-volatile memory cell provided on a first insulator above a substrate; and a second non-volatile memory cell provided on a second insulator above the first non-volatile memory cell, wherein the first non-volatile memory cell includes: a first semiconductor layer including an n-type region and a p-type region provided on the first insulator; and a first gate stack which is provided on the first insulator under the first semiconductor layer and includes a first charge storage layer disposed below the first semiconductor layer and a first control gate electrode disposed below the first charge storage layer, wherein the second non-volatile memory cell includes: a second semiconductor layer including an n-type region and a p-type region provided on the second insulator; and a second gate stack which is provided above the second semiconductor layer and includes a second charge storage layer disposed above the second semiconductor layer and a second control gate electrode disposed above the second charge storage layer, the second gate stack is positioned to be aligned with the first gate stack.

BRIEF DESCRIPTION OF THE SEVERAL VIEWS OF THE DRAWINGS

FIG. 3 is a cross-sectional view for explaining an example of a word line contact in the three-dimensional non-volatile semiconductor storage device according to modification 1 of the present invention;

DETAILED DESCRIPTION OF THE INVENTION

Figure 1:
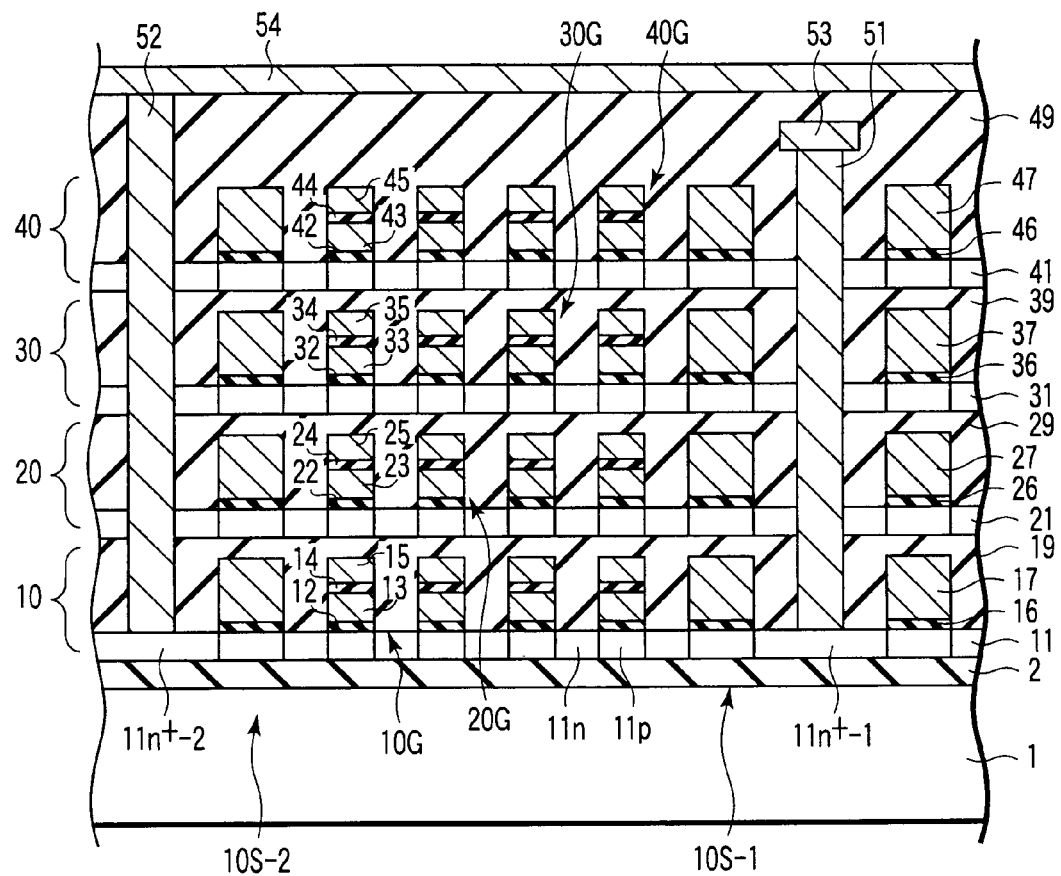
FIG. 1 is a view for explaining an example of a cross-sectional structure of a three-dimensional non-volatile semiconductor storage device according to a first embodiment of the present invention.

According to an embodiment of the present invention, a three-dimensional non-volatile semiconductor storage device in which a plurality of memory cell layers are laminated and each memory cell layer has an SOI structure and includes a charge storage layer is provided. Further, the three-dimensional non-volatile semiconductor storage device can be operated under control of a back gate electrode, thus improving performance of the semiconductor device. Thus, the non-volatile semiconductor storage device which realizes both a higher packing density and an improved performance can be provided.

The embodiments of the present invention will be described with reference to the accompanying drawings. The accompanying drawings, which are incorporated in and constitute a part of the specification, illustrate embodiments of the invention, and together with the general description given above and the detailed description of the embodiments given below, serve to explain principles of the invention. Throughout the drawings, corresponding portions are denoted by corresponding reference numerals. The embodiments are only examples, and various changes and modifications may be made without departing from the scope and spirit.

First Embodiment

A non-volatile semiconductor storage device according to a first embodiment of the present invention is a three-dimensional non-volatile semiconductor storage device having a structure where a plurality of memory cell layers each having an SOI structure are laminated. The non-volatile semiconductor storage device according to this embodiment will now be explained hereinafter while taking an NAND-type flash memory having a double-layered gate structure having a floating gate electrode and a control gate electrode as an example. However, the embodiment is not limited to the NAND-type flash memory and may be also applied to other non-volatile semiconductor storage devices, e.g., an NOR-type flash memory and the like, a metal-oxide-nitride-oxide-silicon (MONOS) type non-volatile semiconductor storage device using a silicon nitride film (an $Si_3N_4$ film) as a charge storage layer in place of the floating gate electrode, or a tantalum nitride-aluminum oxide-oxide-nitride-oxide-silicon (TANOS) type non-volatile semiconductor storage device using a control gate electrode formed of a tantalum nitride film and a high-dielectric-constant insulator, e.g., an alumina film (an $Al_2O_3$ film) as a charge storage layer.

FIG. 1 shows a cross-sectional structure of a three-dimensional NAND-type flash memory according to this embodiment. FIG. 1 depicts four laminated memory cell array layers 10, 20, 30, and 40 which are formed on an insulator 2 above a semiconductor substrate 1. It is to be noted that the number of the laminated layers is not limited to four, and it may be smaller or larger than this value. FIG. 1 is a cross-sectional view in a memory cell chain direction along which the NAND-type memory cells are connected with each other in series. Each memory cell array layer has the same structure. For example, the first memory cell array layer 10 includes: a plurality of first gate stacks (memory cells) 10G formed on a first semiconductor layer 11 which is, e.g., a silicon layer, each first gate stack 10G including a first tunnel insulator 12 formed on the first semiconductor layer 11, a first floating gate electrode 13, a first inter-electrode insulator 14, and a first control gate electrode 15; and first layer first and second select transistors 10S-1 and 10S-2 each provided on either one of each side of the first gate stacks (memory cell) 10G chain. Although the number of the gate stacks in each chain is four in the drawing, the number of the gate stacks is not limited thereto, and it may be set to any number, e.g., 8, 16, 32, or 64. Each first layer select transistor 10S includes a first gate oxide film 16 formed on the first semiconductor layer 11 and a first selective gate electrode 17. The first semiconductor layer 11 includes channel regions lip (p-type semiconductor regions) of the first memory cells 10G and the first layer select transistor 10S, n-type semiconductor regions $11n$ which electrically connects the plurality of first memory cells 10G, and $n^+$ semiconductor regions $11n^+$ as sources/drains of the first layer select transistors 10S, for example. The first semiconductor layer 11 is not limited to one explained above, and channel regions of the first layer select transistors 10S may be determined as p-type semiconductor regions, and any other regions may be determined as n-type semiconductor regions, for example.

The first gate stacks 10G and the first layer select transistors 10S are covered with a first interlevel insulator 19 having a planarized upper surface. The second memory cell array 20 having the same structure as that of the first memory cell array 10 is formed on the first interlevel insulator 19 and covered with a second interlevel insulator 29 having a planarized upper surface. Furthermore, the third memory cell array 30 is formed on the second interlevel insulator 29 and covered with a third interlevel insulator 39 having a planarized upper surface, and the fourth memory cell array 40 is formed on the third interlevel insulator 39. The fourth memory cell array 40 is covered with a fourth interlevel insulator 49 having a planarized upper surface.

The gate stacks 10G, 20G, 30G, and 40G in respective layers are positioned to be aligned each other. That is, each of the gate stacks is aligned to be disposed just above/below each other in a vertical direction. Moreover, a distance between each gate stack and a semiconductor layer immediately above, e.g., a distance between the first gate stack 10G and the second semiconductor layer 21, is set to satisfy the following conditions: (1) the interlevel insulator dose not cause dielectric breakdown between the control gate electrode of the gate stack in the lower layer and the semiconductor layer in the upper layer in write and erase operations; (2) current leakage due to, e.g., Fowler-Nordheim (F-N) tunneling, does not occur between the control gate electrode of the gate stack in the lower layer and the semiconductor layer in the upper layer in write and erase operations; and (3) electric charges are not injected into the charge storage layer of the gate stack in the lower layer due to application of a back gate voltage to the control gate electrode of the gate stack in the lower layer in write, erase, and read operations, for example. In order to satisfy these conditions, controlling the distance between each gate stack and the semiconductor layer immediate above to a preferable value, e.g., 30 to 40 nm, is desirable. This preferable distance varies dependence on, e.g., a material of the interlevel insulator and/or a magnitude of a back gate voltage. The distance can be varied in order to effectively perform a back gate operation which will be explained later in detail.

Additionally, a first contact plug 51 which pierces the first to fourth interlevel insulators 19, 29, 39, and 49 and the second to fourth semiconductor layers 21, 31, and 41 is provided to reach the $n^+$ semiconductor region $11n^+$-1 which is a source of the first layer first select transistor 10S-1. Likewise, a second contact plug 52 is provided to reach the $n^+$ semiconductor region $11n^+$-2 which is a drain of the first layer second select transistor 10S-2. The first and second contact plugs 51 and 52 are electrically connected with the first to fourth semiconductor layers 11, 21, 31, and 41. As a material of each contact plug, using a metal which forms a silicide, e.g., tungsten (W), titanium (Ti), nickel (Ni), or the like, is preferable. When such a metal is used, a silicide is formed in connecting portion between the first or second contact plugs 51 or 52 and the first to fourth semiconductor layers 11, 21, 31, and 41, and ohmic connection may be facilitated. Further, the first contact plug 51 is connected with a source line 53, and the second contact plug 52 is connected with a bit line 54.

Figure 2:
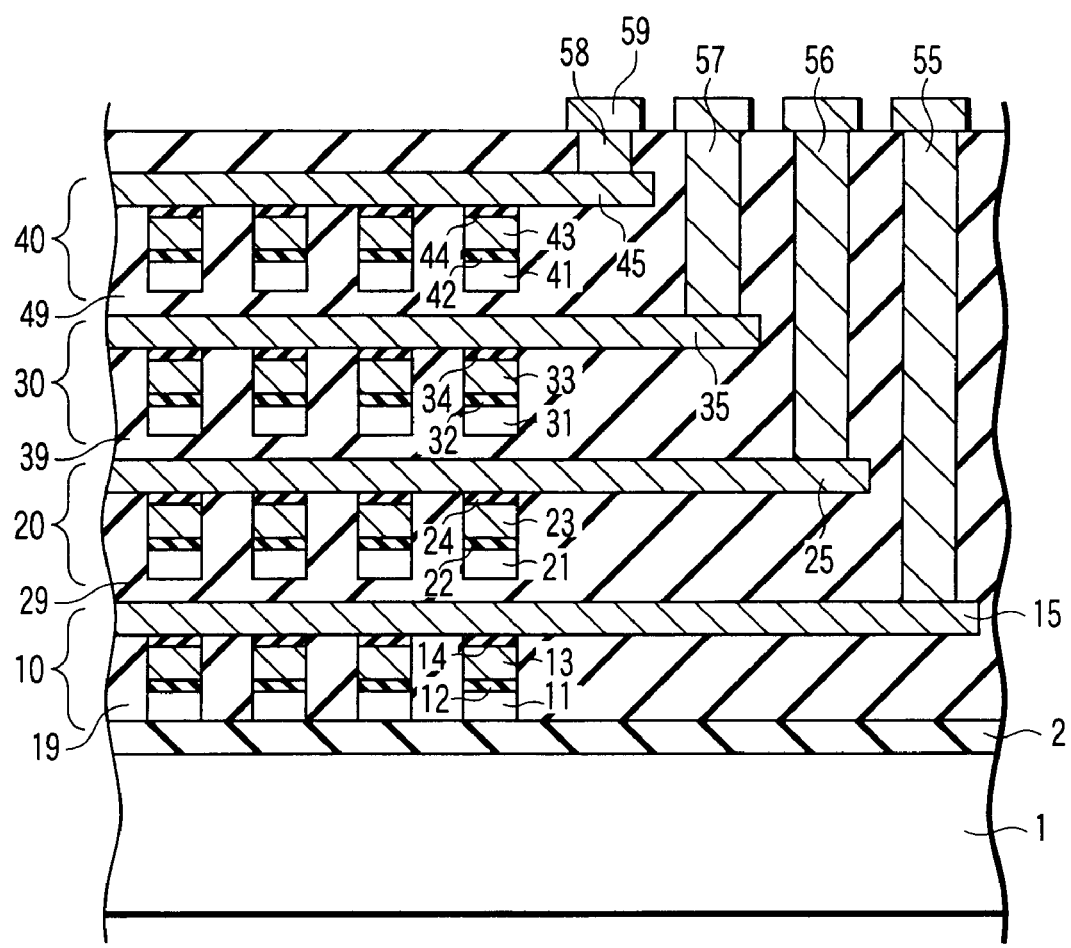
FIG. 2 is a cross-sectional view for explaining an example of a word line contact in the three-dimensional non-volatile semiconductor storage device according to the first embodiment of the present invention.

The control gate electrodes 15, 25, 35, and 45 of the memory cell arrays in each layer are connected with the plurality of control gate electrodes in a direction vertical to a page surface of FIG. 1 to function as word lines. As shown in FIG. 2, the control gate electrodes 15, 25, 35, and 45 in the respective layers 10, 20, 30, or 40 are formed in a step-like pattern as a whole at the end portion of memory cell array, thereby connecting each control gate electrodes 15, 25, 35, and 45 at different depths to corresponding word interconnection lines 59 via first to fourth word line contact plugs 55, 56, 57, and 58.

A back gate operation in the non-volatile semiconductor storage device having the simple lamination-type structure according to the embodiment, e.g., the NAND-type flash memory, will now be explained. Here, a write operation, a read operation, and an erase operation of the second memory cell array 20 will be explained as an example. In such operations, the first control gate electrode 15 functions as a back gate electrode.

Characteristics of the operations using the back gate lie in that a voltage is applied to the back gate of non-selected memory cells in a selected memory cell array. As a result, a channel is formed in the semiconductor layer on the back gate electrode side of the non-selected memory cell to turn on the non-selected memory cell. In a conventional non-volatile memory cell, an on-voltage (which is generally a high voltage) depending on each operation needs to be applied to the non-selected control gate electrodes to turn on the non-selected memory cells at the time of the write operation and the read operation in particular. In that time, if a tunnel insulator of a memory cell is degraded due to repetition of the write and erase operations, then application of the on-voltage to the memory cell causes injection of electric charges into the charge storage layer from the channel region due to a low-electric field leakage current through the tunnel insulator. As a result, a threshold voltage of the memory cell varies. As explained above, application of the on-voltage to the non-selected control gate electrode is one of the causes of, e.g., a write disturbance failure and/or a read disturbance failure. On the other hand, in the back gate operation, the on-voltage does not have to be applied to the non-selected control gate electrode, and a channel is not formed immediately below the tunnel insulator of the non-selected memory cell. Therefore, a margin with respect to an erroneous write operation or an erroneous read operation can be increased, thus considerably reducing the write disturbance failure and/or the read disturbance failure.

In the write operation and the read operation of the second memory cell array 20, each of select transistors 10S, 30S, and 40S of the first, third, and fourth memory cell arrays 10, 30, 40 is turned off. As a result, the first, third, and fourth memory cell arrays 10, 30, and 40 enter a floating state, and cell operations are not carried out. In an operation of the second memory cell array 20, the control gate electrode 15 of the first memory cell array 10 is allowed to function as the back gate electrode. Here, a control gate voltage of a selected memory cell (a selected control gate voltage) is represented by Vcgs, and a selected back gate voltage of the same is represented by Vbgs. In a memory cell which is not selected (a non-selected memory cell), a control gate voltage (a non-selected control gate voltage) is represented by Vcgn, and a non-selected back gate voltage is represented by Vbgn.

In the write operation of the second memory cell array 20, a write voltage is applied to the control gate electrode 25 (the selected gate) of the selected memory cell in which data is to be written. For example, Vcgs=20V. A selected back gate voltage of the selected memory cell (a control gate voltage of a control gate of the first memory cell array positioned immediately below the selected gate) is Vbgs=0V or a floating voltage. A control gate voltage of the non-selected memory cells (a non-selected control gate voltage), in which data is not written, in the second memory cell array 20 is Vcgn=0V and a non-selected back gate voltage of the non-selected memory cell is, e.g., Vbgn=18V. Under such combination of gate voltages, in the non-selected memory cell, a channel is formed on the back gate electrode 15 side in the second semiconductor layer 21 and the on-state is provided, and in the selected gate, a channel is formed on the gate stack 20G side in the second semiconductor layer 21. As a result, a write potential corresponding to a bit line potential is applied to the source side of the selected memory cell, and data is written into the floating gate electrode 23. After a predetermined writing time, the control gate voltage of the selected memory cell is set to Vcgs=0V to terminate the predetermined memory cell write operation.

As explained above, in the non-selected memory cell, since a channel is not formed on the gate stack side of the semiconductor layer, a probability of occurrence of an erroneous write operation can be greatly reduced.

In the read operation of the second memory cell array 20, the control gate voltage of the selected memory cell (the selected control gate voltage), from which data is read, is set to Vcgs=0V, and the selected back gate voltage is also set to Vbgs=0V. In the non-selected memory cell, from which data is not read, the non-selected control gate voltage is set to Vcgn=0V or a floating voltage, and the non-selected back gate voltage is set to, e.g., Vbgn=10V to turn on the non-selected memory cell. As a result, a current corresponding to an amount of electric charge stored in the floating gate electrode of the selected memory cell flows, thereby reading data.

In the erase operation of the second memory cell array 20, the gate electrodes of each of select transistors 10S, 30S, and 40S in the first, third, and fourth memory cell arrays 10, 30, and 40 are set to a floating state. A source line potential and a bit line potential of the second memory cell array 20 are respectively set to 0V. In order to turn on the non-selected memory cell, one of the non-selected control gate voltage and the non-selected back gate voltage is set to, e.g., Vcgn=5V or Vbgn=10V. Setting the non-selected back gate voltage to Vbgn=10V is preferable to improve reliability of the semiconductor device. An erase voltage, e.g., −20V (Vcgs=−20V), is applied to the control gate electrode 25 of the selected memory cell for a predetermined time to extract electric charges in the floating gate electrode 23 into the second semiconductor layer 21. This operation is sequentially performed in the respective memory cells, thereby erasing data in the entire memory cell array. Alternatively, data in the entire memory cell array can be collectively erased.

As explained above, performing the back gate operation enables improving operation characteristics of the non-volatile semiconductor storage device.

Although the NAND-type flash memory cell array in which the plurality of gate stacks are connected in series has been explained as an example in the foregoing embodiment, the present invention may be applied to a non-volatile semiconductor storage device having a different structure, e.g., a three-dimensional memory cell array in which memory cells formed of one gate stack and select transistor are three dimensionally arranged.

As explained above, according to this embodiment, the plurality of memory cell layers can be laminated, and the control gate electrode in a lower layer can be allowed to function as the back gate electrode to a layer thereon, thereby providing a three-dimensional non-volatile semiconductor storage device realizing both increased packing density and improved performance.

(Modification 1)

In the first embodiment, the first memory cell array 10 is a dummy memory cell array in which the first control gate electrode 15 is just used as the back gate electrode when the second memory cell array 20 is operated. In a three-dimensional non-volatile semiconductor storage device according to Modification 1, a first memory cell array 10 is operated as an actual memory cell array like the memory cell array in the upper layer in the first embodiment. Therefore, as shown in FIG. 3, there is provided a three-dimensional semiconductor storage device in which a plurality of back gate electrodes 8 are formed in an insulator 2 below the first memory cell array 10. The back gate electrode 8 is provided to align with a corresponding first gate stack 10G. A distance between the back gate electrode 8 and the first semiconductor layer 11 is preferably controlled to, e.g., 30 to 40 nm like the distance between the first control gate electrode 15 and the second semiconductor layer 21. Structures other than the part concerning the back gate electrode 8 are the same as those in the first embodiment, thereby omitting a detailed explanation thereof.

Providing the back gate electrode 8 in this manner enables the first memory cell array to perform an operation under the back gate control, a higher packing density than that in the first embodiment can be realized, and to provide the three-dimensional non-volatile semiconductor storage device having excellent characteristics.

Second Embodiment

A non-volatile semiconductor storage device according to a second embodiment of the present invention is a three-dimensional non-volatile semiconductor storage device in which every other memory cell layer has a structure turned upside down.

Figure 4:
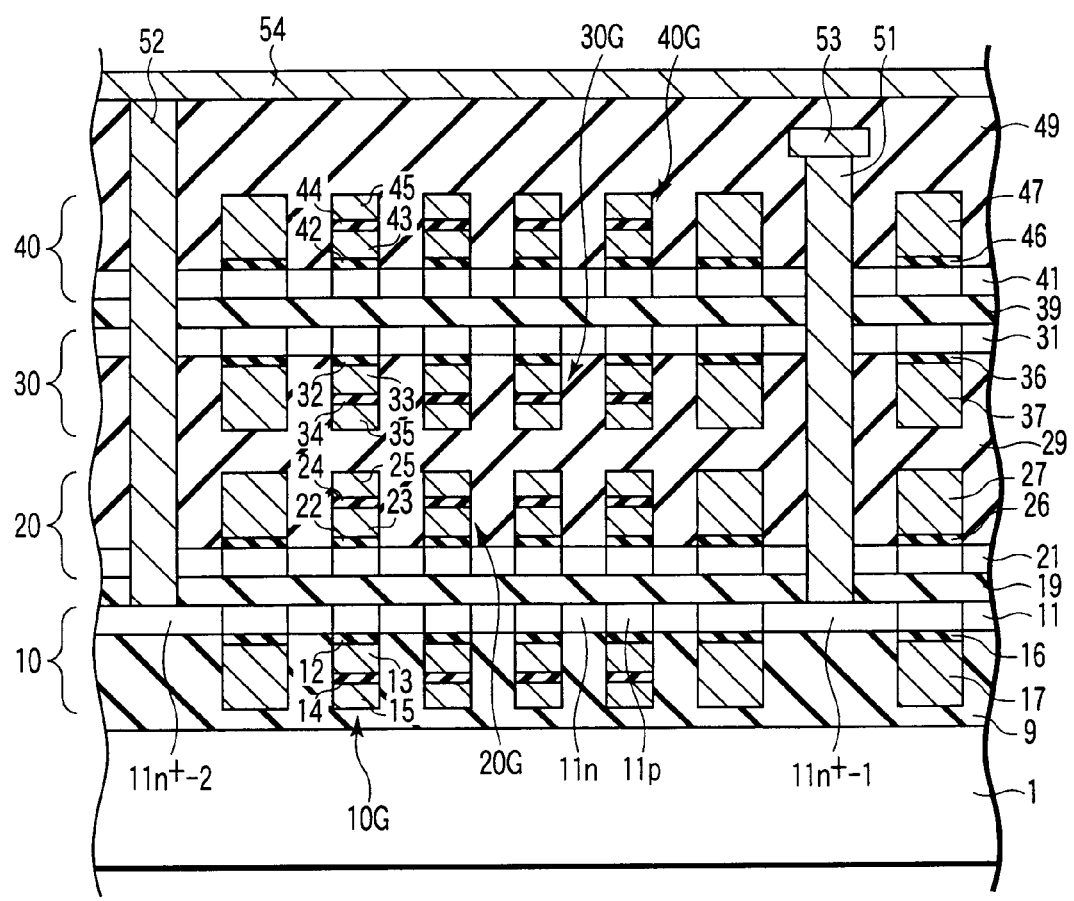
FIG. 4 is a cross-sectional view for explaining an example of a word line contact in the three-dimensional non-volatile semiconductor storage device according to the second embodiment of the present invention.

FIG. 4 shows an example of a cross-sectional structure of a three-dimensional NAND-type flash memory according to this embodiment. FIG. 4 depicts memory cell arrays 10, 20, 30, and 40 in four layers formed on a semiconductor substrate 1. It is to be noted that the number of the laminated layers is not limited to four and it may be smaller or larger than this value as long as it is an even number. As shown in FIG. 4, the memory cell arrays 10 and 30 in the odd-numbered layers are turned upside down to face the memory cell arrays in the even-numbered layers so that semiconductor layers 11 and 21 face each other and semiconductor layers 31 and 41 face each other. That is, for example, a gate stack 10G in the first memory cell array 10 is sequentially stacked in a first interlevel insulator 9 in a reversed order from bottom; a first control gate 15, a first inter-electrode insulator 14, a first floating gate electrode 13, a first tunnel insulator 12, and a first semiconductor layer 11. A second interlevel insulator 19 is provided on the first semiconductor layer 11. The second memory cell array 20 having a structure of regular stacking order is provided on the second interlevel insulator 19 above the first memory cell array 10. That is, a second gate stack 20G includes a second semiconductor layer 21, a second tunnel insulator 22, a second floating gate electrode 23, a second inter-electrode insulator 24, and a second control gate electrode 25 which are stacked from the lower side in a regular order. In this manner, the respective semiconductor layers, e.g., the first semiconductor layer 11 and the second semiconductor layer 21 are provided to face each other interposing the insulator, e.g., the second interlevel insulator 19 therebetween.

In the non-volatile semiconductor storage device according to this embodiment, a back gate voltage is applied to the control gate electrodes in the memory cell arrays provided in the facing side during an operation, and occurrence of, e.g., a read disturbance failure is thereby avoided, thus realizing improved performance of the non-volatile semiconductor storage device.

Since the back gate operation is the same as that in the first embodiment, thereby omitting a detailed explanation thereof.

As explained above, according to this embodiment, the memory cell arrays in the plurality of layers can be laminated, thereby providing the three-dimensional non-volatile semiconductor storage device which realizes both increased packing density and improved performance.

(Modification 2)

In the second embodiment, a distance between two control gate electrodes in the memory cell arrays facing each other is large. In order to achieve a further effective back gate operation, it is preferable to provide each back gate electrode near each semiconductor layer. In a non-volatile semiconductor storage device according to this modification, like Modification 1 of the first embodiment, a plurality of back gate electrodes are provided near two semiconductor layers in which channels are formed.

Figure 5:
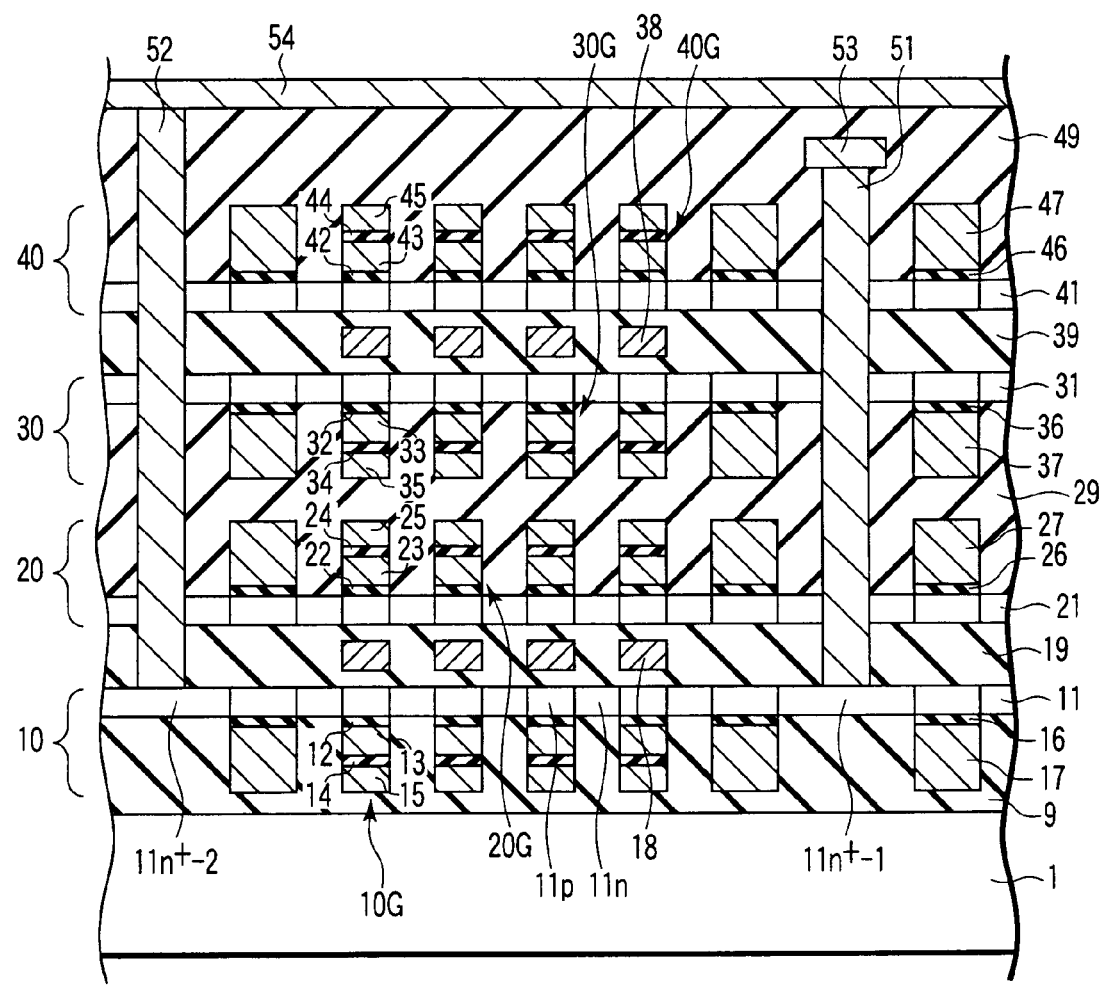
FIG. 5 is a cross-sectional view for explaining an example of a word line contact in the three-dimensional non-volatile semiconductor storage device according to modification 2 of the present invention.

FIG. 5 shows an example of a cross-sectional structure of a three-dimensional NAND-type flash memory according to this modification. In the drawing, first back gate electrodes 18 are provided in a second interlevel insulator 19 between first and second semiconductor layers 11 and 21 facing each other, and second back gate electrodes 38 are provided in a fourth interlevel insulator 39 between third and fourth semiconductor layers 31 and 41. By providing each back gate electrode near a channel region of each semiconductor layer, a back gate operation having a higher efficiency than that of the second embodiment can be performed. Controlling a distance between the back gate electrode 18 and the first or second semiconductor layer 11 or 21 and a distance between the back gate electrode 38 and the third or fourth semiconductor layer 31 or 41 to, e.g., 30 or 40 nm is preferable like the above embodiments.

Providing the back gate electrodes 18 and 38 in this manner enables performing the efficient back gate operation with respect to the memory cell array in each layer, thus providing the three-dimensional non-volatile semiconductor storage device which can realize increased packing density and has excellent characteristics.

(Modification 3)

A non-volatile semiconductor storage device according to Modification 3 is a three-dimensional non-volatile semiconductor storage device using a first semiconductor layer 11 having crystallinity superior to those in the first and second embodiments.

Figure 6:
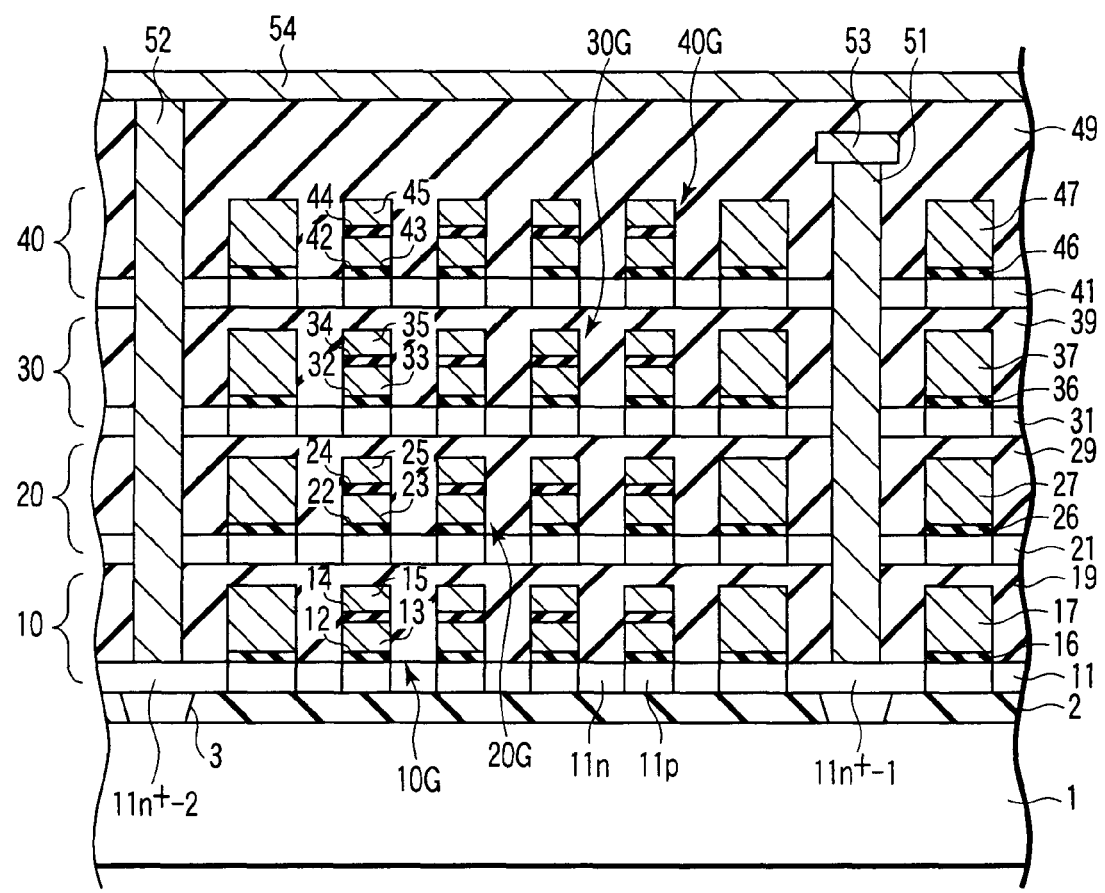
FIG. 6 is a cross-sectional view for explaining an example of a word line contact in the three-dimensional non-volatile semiconductor storage device according to modification 3 of the present invention.

FIG. 6 shows an example of a cross-sectional structure of a three-dimensional NAND-type flash memory according to this modification. FIG. 6 depicts an example where this modification is applied to the first embodiment shown in FIG. 1, but this modification may be also applied to the second embodiment, modifications 1 and 2, and other semiconductor devices having SOI substrate. In order to improve crystallinity of the first semiconductor layer 11, a semiconductor substrate 1, e.g., a single crystal silicon substrate, is used as a seed crystal to crystallize the first semiconductor layer 11. Specifically, each opening 3 is provided in an insulator 2 before forming the first semiconductor layer 11, and then the first semiconductor layer 11, e.g., amorphous silicon, is formed to fill this opening 3 therewith. In a following crystallization annealing, the semiconductor substrate 1 functions as the seed crystal, and the first semiconductor layer 11 which has the same crystal orientation as that of the semiconductor substrate 1 and the excellent crystallinity may be formed by solid-phase epitaxial growth. It is preferable to provide each opening 3 to a position corresponding to a connecting position of a first or second contact plug 51 or 52 respectively connected with a source line 53 or a bit line 54. However, the openings 3 can be formed at any other positions, for example, at positions corresponding to both the contact plug and the first non-volatile memory cell chain.

As explained above, according to this modification, the memory cell arrays in the plurality of layers may be laminated, thereby providing the three-dimensional non-volatile semiconductor storage device which realizes both increased packing density and improved performance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor storage device comprising:
   a first non-volatile memory cell provided on a first insulator above a substrate; and
   a second non-volatile memory cell provided on a second insulator above the first non-volatile memory cell,
   wherein the first non-volatile memory cell includes:
   a first semiconductor layer having a first main surface and a second main surface, the first main surface being below the second main surface, and including an n-type region and a p-type region, the first main surface being in contact with the first insulator; and
   a first gate stack which is provided in the first insulator under the first semiconductor layer and includes a first charge storage layer disposed below the first main surface of the first semiconductor layer and a first control gate electrode disposed below the first charge storage layer,
   wherein the second non-volatile memory cell includes:
   a second semiconductor layer having a third main surface and a fourth main surface, the third main surface being below the fourth main surface, and including an n-type region and a p-type region, the third main surface being in contact with the second insulator; and
   a second gate stack which is provided above the second semiconductor layer and includes a second charge storage layer disposed above the fourth main surface of the second semiconductor layer and a second control gate electrode disposed above the second charge storage layer, the second gate stack is positioned to be aligned with the first gate stack, and the second main surface of the first semiconductor layer contacts the second insulator, and the third main surface of the second semiconductor layer contacts the second insulator.

2. The device according to claim 1, further comprising a third gate electrode which is provided in the second insulator and positioned to be aligned with the first gate stack.

3. The device according to claim 1, wherein each of the first and second gate stacks is positioned to be aligned with the p-type region of each semiconductor layer, and the device further comprising:
   a first non-volatile memory cell chain including: a plurality of first non-volatile memory cells provided on the first semiconductor layer serially connected each other along a first direction to sandwich the n-type regions therebetween; and first select transistors provided at both ends of the plurality of first non-volatile memory cells; and
   a second non-volatile memory cell chains including: a plurality of second non-volatile memory cells provided on the second semiconductor layer serially connected each other along the first direction to sandwich the n-type regions therebetween; and second select transistors provided at both ends of the plurality of second non-volatile memory cells.

4. The device according to claim 3, further comprising contact plugs, each of which pierces the second semiconductor layer, contacts a side surface of the second semiconductor layer and the second main surface of the first semiconductor layer, the second main surface being in an opposite side to a side where the first gate stack is formed, and connects the first and second semiconductor layers with one of interconnection lines arranged above the first and second non-volatile memory cell chains.

5. The device according to claim 1, wherein the first and second charge storage layers are formed of conductor films.

6. The device according to claim 1, wherein the second insulator is formed of an insulator without an electrode.

7. The device according to claim 1, wherein only the second insulator is interposed between the first semiconductor layer and the second semiconductor layer.

* * * * *